(12) United States Patent
McSwiney et al.

(10) Patent No.: US 12,094,766 B2
(45) Date of Patent: Sep. 17, 2024

(54) SELECTIVE BLOCKING OF METAL SURFACES USING BIFUNCTIONAL SELF-ASSEMBLED MONOLAYERS

(71) Applicant: Applied Materials, Inc., Santa Clara, CA (US)

(72) Inventors: Michael L. McSwiney, Scappoose, OR (US); Bhaskar Jyoti Bhuyan, San Jose, CA (US); Mark Saly, Santa Clara, CA (US); Drew Phillips, San Jose, CA (US); Aaron Dangerfield, San Jose, CA (US); David Thompson, San Jose, CA (US); Kevin Kashefi, San Ramon, CA (US); Xiangjin Xie, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/971,212

(22) Filed: Oct. 21, 2022

(65) Prior Publication Data
US 2023/0132200 A1 Apr. 27, 2023

Related U.S. Application Data

(60) Provisional application No. 63/272,627, filed on Oct. 27, 2021, provisional application No. 63/304,840, (Continued)

(51) Int. Cl.
*H01L 21/768* (2006.01)
*B05D 1/00* (2006.01)
*H01L 21/02* (2006.01)

(52) U.S. Cl.
CPC .......... *H01L 21/76829* (2013.01); *B05D 1/60* (2013.01); *H01L 21/02118* (2013.01); (Continued)

(58) Field of Classification Search
CPC ........................................ H01L 21/768–76898
See application file for complete search history.

(56) References Cited

U.S. PATENT DOCUMENTS 10,777,411 B1 * 9/2020 Nguyen ............ H01L 21/02118
10,867,905 B2 12/2020 Wang et al.
(Continued)

FOREIGN PATENT DOCUMENTS

KR      20180002605 A    1/2018
KR      20200127949 A   11/2020
(Continued)

OTHER PUBLICATIONS

PCT International Search Report and Written Opinion in PCT/US2022/047397 dated Mar. 7, 2023, 11 pages.
(Continued)

*Primary Examiner* — Erik Kielin
(74) *Attorney, Agent, or Firm* — Servilla Whitney LLC

(57) ABSTRACT

Methods for selectively depositing on metallic surfaces are disclosed. Some embodiments of the disclosure utilize a hydrocarbon having at least two functional groups selected from alkene, alkyne, ketone, hydroxyl, aldehyde, or combinations thereof to form a self-assembled monolayer (SAM) on metallic surfaces.

14 Claims, 5 Drawing Sheets

Related U.S. Application Data filed on Jan. 31, 2022, provisional application No. 63/338,633, filed on May 5, 2022.

(52) U.S. Cl.
CPC .. *H01L 21/02205* (2013.01); *H01L 21/76846* (2013.01); *H01L 21/76877* (2013.01)

(56) References Cited

U.S. PATENT DOCUMENTS

| | | | |
|---|---|---|---|
| 11,848,229 B2* | 12/2023 | McSwiney | ........ H01L 23/53209 |
| 2003/0214039 A1 | 11/2003 | Yoon | |
| 2004/0197560 A1 | 10/2004 | Inaoka | |
| 2011/0198736 A1 | 8/2011 | Shero et al. | |
| 2014/0045330 A1 | 2/2014 | Tong | |
| 2016/0172366 A1 | 6/2016 | Koka et al. | |
| 2016/0172370 A1 | 6/2016 | Makala et al. | |
| 2017/0342553 A1 | 11/2017 | Yu et al. | |
| 2018/0342391 A1 | 11/2018 | Park et al. | |
| 2019/0157067 A1 | 5/2019 | Bhuyan et al. | |
| 2019/0198318 A1 | 6/2019 | Bhuyan et al. | |
| 2019/0210061 A1 | 7/2019 | Ke et al. | |
| 2019/0316256 A1 | 10/2019 | Bhuyan et al. | |
| 2020/0144107 A1* | 5/2020 | Dutta | ................ H01L 21/76816 |
| 2020/0168453 A1 | 5/2020 | Saly et al. | |
| 2020/0216949 A1 | 7/2020 | Bhuyan et al. | |
| 2020/0266202 A1 | 8/2020 | Kwon | |
| 2020/0321247 A1 | 10/2020 | Chen et al. | |
| 2020/0347493 A1 | 11/2020 | Liu et al. | |
| 2020/0350204 A1 | 11/2020 | Yu et al. | |
| 2021/0082814 A1* | 3/2021 | Lee | ........... H01L 21/32 |
| 2021/0285102 A1 | 9/2021 | Yoon et al. | |
| 2021/0313228 A1* | 10/2021 | Nguyen | ................ H01L 21/321 |
| 2022/0084937 A1* | 3/2022 | Liu | .................. H01L 21/76846 |

FOREIGN PATENT DOCUMENTS

| | | |
|---|---|---|
| WO | 2016040077 A1 | 3/2016 |
| WO | 2018098197 A1 | 5/2018 |
| WO | 2021067118 A1 | 4/2021 |

OTHER PUBLICATIONS

PCT International Search Report and Written Opinion in PCT/US2022/036176 dated Nov. 10, 2022, 11 pages.

Herrer, L. , et al., "High surface coverage of a self-assembled monolayer by in situ synthesis of palladium nanodeposits", Nanoscale, 2017, vol. 9, Issue 35, pp. 13281-13290.

Non-Final Office Action in U.S. Appl. No. 17/498,190 dated Jul. 6, 2023, 30 pages.

Non-Final Office Action in U.S. Appl. No. 17/971,217 dated Jul. 7, 2023, 31 pages.

PCT International Search Report and Written Opinion in PCT/US2023/017807 dated Jul. 24, 2023, 10 pages.

Mameli, Alfredo , et al., "Area-Selective Atomic Layer Deposition of SiO2 Using Acetylacetone as a Chemoselective Inhibitor in an ABC-Type Cycle", ACS Nano 2017, 11, 9303-9311.

* cited by examiner

SELECTIVE BLOCKING OF METAL SURFACES USING BIFUNCTIONAL SELF-ASSEMBLED MONOLAYERS

CROSS-REFERENCE TO RELATED APPLICATIONS

This application claims priority to U.S. Provisional Application No. 63/272,627, filed Oct. 27, 2021, U.S. Provisional Application No. 63/304,840, filed Jan. 31, 2022, and U.S. Provisional Application No. 63/338,633, filed May 5, 2022, the entire disclosures of which are hereby incorporated by reference herein.

TECHNICAL FIELD

Embodiments of the disclosure generally relate to methods of forming a semiconductor structure. More particularly, some embodiments of the disclosure are directed to methods of selective deposition on non-metallic surfaces using self-assembled monolayer using a precursor, wherein the precursor comprises at least two functional groups selected from alkene, alkyne, ketone, hydroxyl, aldehyde, ester, or combinations thereof.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization.

Reducing the resistance of the via is critical for improved performance of the electronic device. The via resistance reduction is usually controlled by minimizing cladding and by reducing the resistivity of the via material. Thus, there is a need for a method of reducing via resistance

SUMMARY

One or more embodiments of the disclosure are directed to a method of forming a semiconductor structure. In some embodiments, the method comprises selectively depositing a self-assembled monolayer (SAM) on a first surface of a substrate by exposing the substrate to a first precursor, wherein the substrate has at least one feature comprising the first surface and a second surface and wherein the first precursor comprises at least two functional groups selected from alkene, alkyne, ketone, hydroxyl, aldehyde, or combinations thereof, selectively depositing a liner on the second surface by exposing the substrate to a second precursor, and removing the self-assembled monolayer. In some embodiments, the first surface comprises a metal. In some embodiments, the second surface comprises a dielectric material.

In one or more embodiments, the method comprises exposing a substrate to at least one first precursor to selectively deposit a self-assembled monolayer (SAM) on a first surface of the substrate, the substrate having at least one feature comprising the first surface and a second surface, exposing the substrate to a second precursor to selectively deposit a liner on the second surface, and removing the self-assembled monolayer (SAM). In some embodiments, the first surface comprises a metal selected from one or more of copper (Cu), cobalt (Co), ruthenium (Ru), tungsten (W) and molybdenum (Mo). In some embodiments, the second surface comprises a dielectric material. In some embodiments, the first precursor has a molecular weight in a range of from 50 Daltons to 500 Daltons. In some embodiments, the first precursor has a vapor pressure in a range of from 100 mTorr to 100 Torr at 120° C. In some embodiments, the first precursor is selected from the group consisting of structures of Formula (vi), Formula (vii), Formula (viii), Formula (ix), Formula (x), Formula (xi)

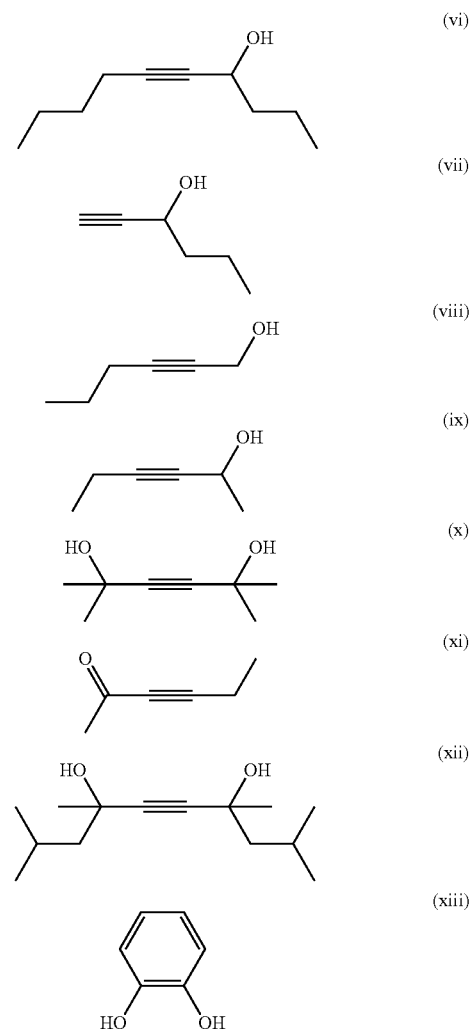

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

DETAILED DESCRIPTION

Figure 1:
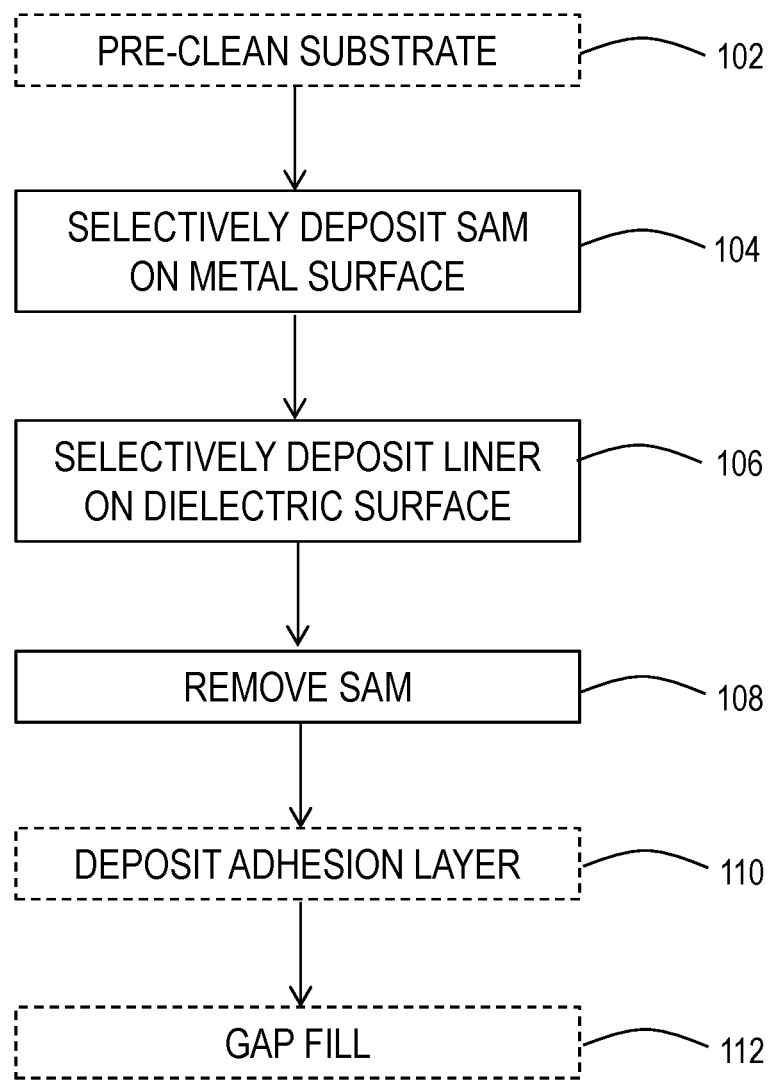
FIG. 1 illustrates a process flow diagram of a method according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

A metal can be grown by atomic layer deposition for many applications. One or more embodiments of the disclosure advantageously provide processes for atomic layer deposition to form metal-containing films. As used in this specification and the appended claims, the term "metal-containing film" refers to a film that comprises metal atoms and has greater than or equal to about 1 atomic % metal, 2 atomic % metal, 3 atomic % metal, 4 atomic % metal, 5 atomic % metal, 10 atomic % metal, 15 atomic % metal, 20% atomic metal, 25% atomic metal, 30% atomic metal, 35% atomic metal, 40% atomic metal, 45% atomic metal, 50% atomic metal, 55% atomic metal, 60% atomic metal, or 65% atomic metal. In some embodiments, the metal-containing film comprises one or more of a metal, a metal nitride, a metal carbide, or a metal oxide. The skilled artisan will recognize that the use of molecular formula like MO, where M is a metal, does not imply a specific stoichiometric relationship between the elements but merely the identity of the major components of the film. For example, MO refers to a film whose major composition comprises a metal and oxygen atoms. In some embodiments, the major composition of the specified film (i.e., the sum of the atomic percent of the specified atoms) is greater than or equal to about 95%, 98%, 99% or 99.5% of the film, on an atomic basis.

The phrase "metallic material surface" or "non-metallic material surface" as used herein refers to the surface of a metallic or non-metallic material, respectively. A non-metallic material, for the purposes of this disclosure, is any material that exhibits the properties of a poor conductor, or a good insulator. A non-metallic material may include metal atoms (e.g., tantalum nitride, titanium nitride) and still fall into the scope of non-metallic materials. In some embodiments, the term "conductive material" is used in place of metallic material. In some embodiments, the term "dielectric material" is used in place of non-metallic material.

The phrase "selectively depositing on a first surface over a second surface", and the like, as used herein means that a first amount or thickness is deposited on the first surface and a second amount or thickness is deposited on the second surface, where the second amount or thickness is less than the first amount or thickness, or, in some embodiments, no amount is deposited on the second surface.

The term "over" as used herein does not imply a physical orientation of one surface on top of another surface, rather a relationship of the thermodynamic or kinetic properties of the chemical reaction with one surface relative to the other surface. For example, selectively depositing a film onto a metallic material surface over a non-metallic material surface means that the film deposits on the metallic material surface and less or no film deposits on the non-metallic material surface; or that the formation of the film on the metallic material surface is thermodynamically or kinetically favorable relative to the formation of a film on the non-metallic material surface.

Reducing contact resistance (Rc) for 3 nm node (N3) and beyond semiconductor structures is critical. One or more embodiments of this disclosure are directed to methods of selectively forming a self-assembled monolayer (SAM) on a first surface of a substrate over a second surface. The substrate comprises a metallic material (conductive material) with a first surface and a non-metallic material (dielectric material) with a second surface. In some embodiments, the first surface may be described as a metallic material surface or conductive material surface. In some embodiments, the first surface comprises one or more of copper (Cu), cobalt (Co), ruthenium (Ru), tungsten (W), and molybdenum (Mo). In some embodiments, the second surface may be described as a non-metallic material surface or a dielectric material surface. In some embodiments, the method described herein have middle end of line (MEOL) and back end of line (BEOL) applications.

With reference to FIG. 1, which is a process flow diagram, one or more embodiments of the disclosure are directed to a method 100 of forming an electronic device. The method illustrated in FIG. 1 is representative of an integrated process.

Figure 2A:
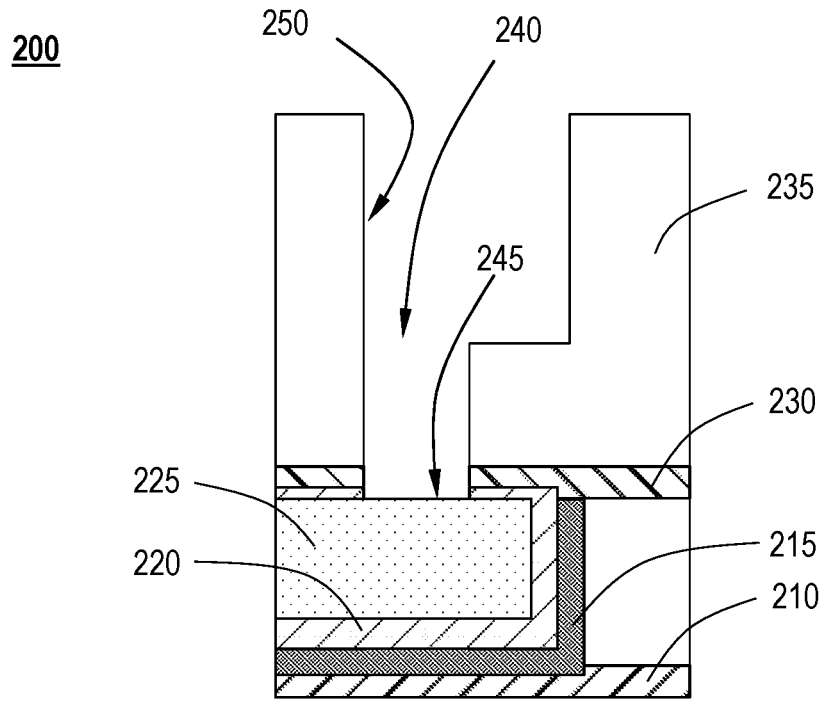
FIGS. 2A-2F illustrate cross-sectional views of an exemplary substrate during processing according to one or more embodiments of the disclosure.

FIG. 2A thru 2F illustrate cross-sectional views of an exemplary device 200 during the processing method 100 according to one or more embodiments of the disclosure. Referring to FIG. 2A, a substrate 210 is provided having a barrier layer 215, a metal liner 220, a conductive layer 225, an etch stop layer 230, and a dielectric layer 235 thereon. In one or more embodiments, the dielectric layer 235 has at least one feature 240. In some embodiments, the substrate 210 is a wafer, for example a semiconductor substrate. In some embodiments, the substrate 210 is an etch stop layer on a wafer.

For illustrative purposes, FIG. 2A shows the substrate 210 having a single feature 240. One skilled in the art, however, will understand that there can be more than one feature. As shown in FIG. 2A, the feature 240 includes a first surface 245 and a second surface 250. In some embodiments, the first surface 245 is a bottom surface of the feature 240. In some embodiments, the second surface 250 is a sidewall of the feature 240. The shape of the feature 240 can be any suitable shape including, but not limited to, trenches, vias that, when filled with metal, transfer current between layers, and lines that transfer current within the same device layer. It will be appreciated that in one or more embodiments, the conductive layer 225 forms a metal line that transfers current within the same device layer. In some embodiments, the feature 240 defines a gap in the dielectric layer 235. As used herein, the term "feature" refers to any intentional surface irregularity. Suitable examples of features include, but are not limited to, trenches which have a top, two sidewalls, and a bottom, peaks which have a top and two sidewalls. Features can have any suitable aspect ratio (ratio of the depth of the feature to the width of the feature). In some embodiments, the aspect ratio is greater than or equal to about 1:1, 2:1, 3:1, 4:1, 5:1, 10:1, 15:1, 20:1, 25:1, 30:1, 35:1 or 40:1.

In one or more embodiments, the barrier layer 215 is a conformal layer. The barrier layer 215 may comprise any suitable material known to the skilled artisan and may be deposited by any suitable technique known to the skilled artisan. In some embodiments, the barrier layer is selected from titanium nitride (TiN), tantalum nitride (TaN), or tungsten nitride (WN). In specific embodiments, the barrier layer 215 comprises tantalum nitride (TaN). In some embodiments, the barrier layer 215 is formed by ALD. In some embodiments, the barrier layer 215 prevents diffusion of material across itself to layers below.

In one or more embodiments, the metal liner 220 may comprise any suitable metal material known to the skilled artisan and may be deposited by any technique known to the skilled artisan. In one or more embodiments, the metal liner 220 comprises one or more of copper (Cu), cobalt (Co), ruthenium (Ru), iridium (Ir), rhodium (Rh), molybdenum (Mo), tungsten (W), aluminum (Al), nickel (Ni), and platinum (Pt). In one or more embodiments, the metal liner 220 comprises one or more of a single layer of tungsten (W) or a single layer of molybdenum (Mo). In some embodiments, the metal liner 220 comprises or consists essentially of tungsten or molybdenum. As used in this specification and the appended claims, the term "consists essentially of" means that the material is greater than or equal to about 95%, 98% or 99% of the stated material on an atomic basis.

In one or more embodiments, the conductive layer 225 comprises a metal or a metallic material. In some embodiments, the metal or metallic material can be any suitable metallic material. In some embodiments, the metallic materials of this disclosure are conductive materials. Suitable metallic materials include, but are not limited to, metals, conductive metal nitrides, conductive metal oxides, metal alloys, silicon, combinations thereof, and other conductive materials.

As used in this specification and the appended claims, the term "oxide" or the like means that the material contains the specified element(s). The term should not be interpreted to imply a specific ratio of elements. Accordingly, an "oxide" or the like may comprise a stoichiometric ratio of elements or a non-stoichiometric ratio of elements.

In one or more embodiments, the metal or metallic material may comprise any suitable metal known to the skilled artisan. In some embodiments, the metal or metallic material is selected from one or more of copper (Cu), cobalt (Co), ruthenium (Ru), iridium (Ir), rhodium (Rh), molybdenum (Mo), tungsten (W), aluminum (Al), nickel (Ni), and platinum (Pt). In some embodiments, the metal or metallic material consists essentially of copper (Cu), cobalt (Co), ruthenium (Ru), iridium (Ir), rhodium (Rh), molybdenum (Mo), tungsten (W), aluminum (Al), nickel (Ni), or platinum (Pt). In some embodiments, the metal or metallic material consists essentially of copper, cobalt, ruthenium, tungsten, or molybdenum. In some embodiments, the metallic material comprises or consists essentially of tungsten or molybdenum.

In one or more embodiments, the etch stop layer 230 comprises any suitable material known to the skilled artisan. In one or more embodiments, the etch stop layer 230 comprises one or more of silicon nitride (SiN), silicon carbide (SiC), aluminum oxide ($AlO_x$), and aluminum nitride (AlN). In some embodiments, the etch stop layer 230 may be deposited using a technique selected from CVD, PVD, and ALD.

In one or more embodiments, a portion of the metal liner 220 and the etch stop layer 230 are removed and the bottom first surface 245 of the at least one feature 240 is exposed. In some embodiments, the bottom first surface 245 is a portion of the top surface of the conductive material 225, such that a portion of the conductive material 225 is exposed.

In one or more embodiments, the dielectric layer 235 can be any suitable material. In some embodiments, the dielectric layer 235 insulates adjacent devices and prevent leakage. Suitable dielectric materials include, but are not limited to, silicon oxides (e.g., $SiO_2$), silicon nitrides (e.g., SiN), silicon carbides (e.g., SiC), and combinations thereof (e.g., SiCON). Suitable dielectric materials further include aluminum oxide, aluminum nitride, and low-k dielectric materials. In some embodiments, the dielectric material consists essentially of silicon dioxide ($SiO_2$). In some embodiments, the dielectric layer 235 comprises silicon nitride. In some embodiments, the dielectric layer 235 consists essentially of silicon nitride.

In one or more embodiments, the dielectric layer 235 is deposited using any suitable deposition technique, such as, but not limited to, chemical vapor deposition ("CVD"), physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

In one or more embodiments, the substrate 210 is independently maintained at an operating pressure during one or more operations of the method 100. In some embodiments, the operating pressure is less than or equal to 100 Torr, less than or equal to 80 Torr, less than or equal to 70 Torr, less than or equal to 60 Torr, less than or equal to 50 Torr, less than or equal to 40 Torr, less than or equal to 30 Torr, less than or equal to 20 Torr, less than or equal to 15 Torr, less than or equal to 10 Torr, less than or equal to 5 Torr, less than or equal to 1 Torr, less than or equal to 500 mTorr, less than or equal to 200 mTorr, less than or equal to 100 mTorr, or less than or equal to 50 mTorr. In some embodiments, the operating pressure is 10 Torr, 20 Torr, 30 Torr, 40 Torr, 50 Torr or 100 Torr. In some embodiments, the substrate 210 is maintained at a pressure in a range of from 1 mTorr to 100 Torr, from 1 mTorr to 80 Torr, from 1 mTorr to 60 Torr, from 1 mTorr to 40 Torr, from 1 mTorr to 20 Torr, from 1 mTorr to 10 Torr, from 1 mTorr to 5 Torr, from 1 mTorr to 1 Torr, from 1 mTorr to 500 mTorr, from 1 mTorr to 200 mTorr, from 1 mTorr to 100 mTorr, from 1 mTorr to 50 mTorr, from 500 mTorr to 100 Torr, from 500 mTorr to 80 Torr, from 500 mTorr to 60 Torr, from 500 mTorr to 40 Torr, from 500 mTorr to 20 Torr, from 500 mTorr to 10 Torr, from 500 mTorr to 5 Torr, from 500 mTorr to 1 Torr, from 1 Torr to 100 Torr, from 1 Torr to 80 Torr, from 1 Torr to 60 Torr, from 1 Torr to 40 Torr, from 1 Torr to 20 Torr, from 1 Torr to 10 Torr, from 1 Torr to 5 Torr, from 10 Torr to 100 Torr, from 10 Torr to 80 Torr, from 10 Torr to 60 Torr, from 10 Torr to 40 Torr, from 10 Torr to 20 Torr, from 20 Torr to 100 Torr, from 20 Torr to 80 Torr, from 20 Torr to 60 Torr, or from 20 Torr to 40 Torr during depositing the self-assembled monolayer (SAM) 255.

In some embodiments, the temperature of the substrate is controlled during the method 100. The temperature of the substrate may also be referred to as the operating temperature. In some embodiments, the operating temperature is less than or equal to 450° C., less than or equal to 400° C., less than or equal to 350° C., less than or equal to 300° C., less than or equal to 275° C., less than or equal to 250° C., less than or equal to 225° C., less than or equal to 200° C., less than or equal to 150° C., less than or equal to 100° C., or less than or equal to 80° C. In some embodiments, the operating temperature in a range of from 60° C. to 450° C., from 60° C. to 350° C., from 60° C. to 250° C., from 60° C. to 150° C., from 60° C. to 100° C., from 100° C. to 450° C., from 100° C. to 350° C., from 100° C. to 250° C., from 100° C. to 200° C., from 200° C. to 450° C., from 200° C. to 350° C., from 200° C. to 300° C., from 300° C. to 450° C., from 300° C. to 350° C., or from 400° C. to 450° C. during depositing the self-assembled monolayer (SAM) 255.

Referring to FIG. 1, an exemplary method 100 begins with an optional pre-cleaning operation 102. The pre-cleaning operation can be any suitable pre-cleaning process known to the skill artisan. Suitable pre-cleaning operations include, but are not limited to, soaking, native oxide remove, and the like. In some embodiments the pre-cleaning operation 102 cleans the first surface 245 and the second surface 250. In some embodiments the pre-cleaning operation 102 results in the formation of a surface of the substrate 210, e.g., the first surface 245 and/or the second surface 250, substantially free of oxide. As used herein, the term "substantially free of oxide" means that the surface has less than 10%, less than 5%, less than 4%, less than 3%, less than 2%, or less than 1% oxygen on atomic basis.

Figure 2B:
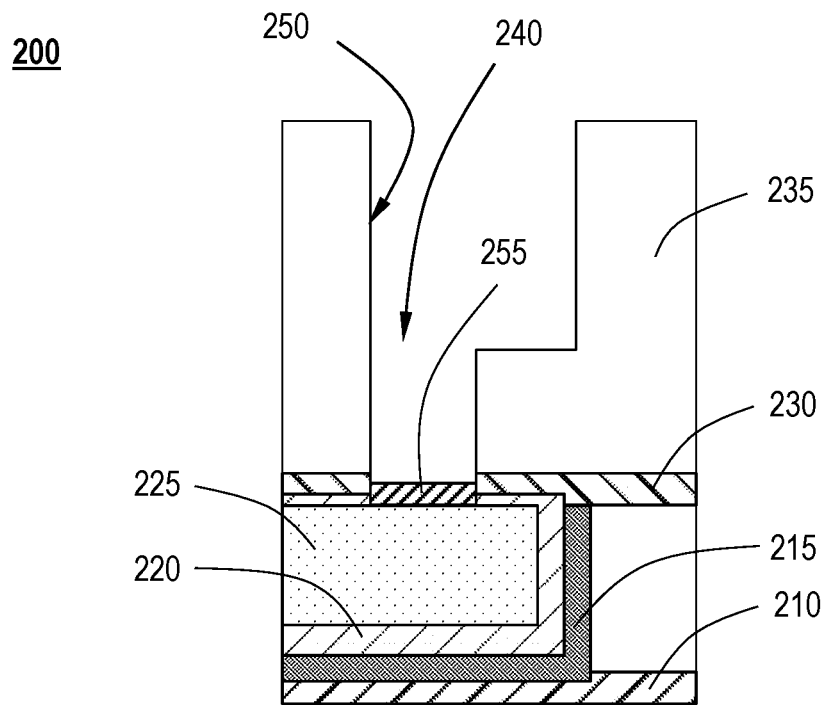

At operation 104, the substrate 210 is exposed to a first precursor to deposit a self-assembled monolayer (SAM) 255. As used herein, the phrase "the substrate is exposed to" means that the substrate, as a whole, including the individual materials and layers thereon are exposed to the stated process or condition. FIG. 2B illustrates the self-assembled monolayer (SAM) 255 deposited on the first surface 245 of the feature 240. In some embodiments, the self-assembled monolayer (SAM) 255 is selectively deposited on the first surface 245 of the feature 240 over the second surface 250. In some embodiments, the self-assembled monolayer (SAM) is not deposited on the second surface 250 of the feature 240. In one or more embodiments, the self-assembled monolayer (SAM) 255 is deposited on the exposed first surface 245 of the conductive layer 225 in the bottom of the feature 240. It is noted that, as described above, a portion of the metal liner 220 and a portion of the etch stop layer 230 are removed, e.g., by etching, to expose a portion, e.g., the first surface 245 of the conductive layer 225 in the bottom of the feature 240. In some embodiments, operation 104 is a dry deposition process.

In some embodiments, "selectively" means that the subject material forms on the selected surface at a rate greater than or equal to about 1.5×, 2×, 3×, 4×, 5×, 7×, 10×, 15×, 20×, 25×, 30×, 35×, 40×, 45×, or 50× the rate of formation on the non-selected surface. Stated differently, the selectivity of the stated process for the selected surface relative to the non-selected surface is greater than or equal to about 3:2, 2:1, 3:1, 4:1, 5:1, 7:1, 10:1, 15:1, 20:1, 25:1, 30:1, 35:1, 40:1, 45:1, or 50:1.

In one or more embodiments, the first precursor reversibly binds to the metal. In some embodiments, the self-assembled monolayer (SAM) 255 formed by the first precursor remains substantially intact during the subsequent operations of the method 100. As used herein, the term "substantially" refers to up to 99%, 98%, 95%, 90%, or 80% of the self-assembled monolayer (SAM) 255 remains intact during the subsequent operations of the method 100.

In some embodiments, the first precursor comprises at least one, at least two, or at least three functional groups. In some embodiments, the functional groups are designed to allow reverse selective ALD deposition. In some embodiments, the functional group comprises unsaturated hydrocarbon (e.g., alkene, alkyne, phenyl or combinations thereof), ketone, hydroxyl, aldehyde, ester, or combinations thereof. In some embodiments, the first precursor comprises at least one unsaturated group. In some embodiments, the first precursor comprises at least one hydroxyl group. In some embodiments, the first precursor comprises at least one aldehyde group. In some embodiments, the first precursor comprises at least one ketone group. In some embodiments, the first precursor comprises at least one ester group. In some embodiments, the first precursor comprises at least two functional groups. In some embodiments, the at least two functional groups are independently selected from an unsaturated hydrocarbon (e.g., alkene, alkyne, phenyl or combinations thereof), a ketone, a hydroxyl, an aldehyde, an ester, or a derivative thereof. In some embodiments, each of the at least three functional groups are independently selected from an unsaturated hydrocarbon (e.g., alkene, alkyne, phenyl or combination thereof), a ketone, a hydroxyl, an aldehyde, an ester, or a derivative thereof. In some embodiments, surface engineering with bifunctional groups allows reverse selective ALD deposition to electrical resistance at a via contact interface. In some embodiments, the bifunctional group functions as a conjugate system. In some embodiments, the conjugate system comprises a lone electron pair group.

Without intending to be bound by theory, it is believed that the d-orbitals of the metallic materials start to share electrons with the sp² orbitals of the unsaturated hydrocarbon. Accordingly, in some embodiments, the unsaturated hydrocarbon comprises at least one compound with at least one double bond between two carbon atoms. In some embodiments, the unsaturated hydrocarbon comprises at least one compound with at least one triple bond between two carbon atoms. Stated differently, in some embodiments, the unsaturated hydrocarbon comprises at least one compound with a general formula according to formula (i) or formula (ii):

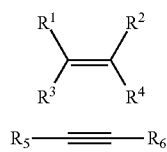

(i)

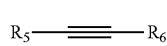

(ii)

In some embodiments, the $R_1$, $R_2$, $R_3$, $R_4$, $R_5$ and $R_6$ are independently selected from H, —$R_7$OH, —CH(OH)$R_8$, —C(OH)$R_9R_{10}$, and —COR$_{11}$. In some embodiments, the $R_7$, $R_8$, $R_9$, $R_{10}$ and $R_{11}$ are independently selected from H and alkyl group. As used in this regard, the alkyl group contains 1-30 carbon atoms. In some embodiments, the alkyl group contains 1-4 carbon atoms. In some embodiments, the alkyl group is a linear group (e.g., a straight-chain saturated or unsaturated hydrocarbon). In some embodiments, the alkyl group is a branched group (e.g., a branched saturated or unsaturated hydrocarbon). In some embodiments, the alkyl group is a cyclic group (e.g., a cyclic saturated or unsaturated hydrocarbon).

Without intending to be bound by theory, it is believed that the likelihood of polymerization advantageously increases as the number of multiple unsaturated bonds increases. The polymerization may make the self-assembled monolayer (SAM) 255 falling off harder during the subsequent operations of the method 100. Further, without intending to be bound by theory, it is believed that the unsaturated hydrocarbon, the self-assembled monolayer (SAM) 255, suppresses one or more of the nucleation or growth rate of a subsequent film on the first surface 245. Accordingly, in some embodiments, the first precursor comprises at least one unsaturated bond, wherein the first surface 245 comprises copper, cobalt, ruthenium, tungsten, molybdenum, or combinations thereof.

In some embodiments, a precursor with a single hydroxyl group is effective to allow reverse selective ALD deposition. In some embodiments, the self-assembled monolayer (SAM) 255 formed with a precursor comprising a single hydroxyl group impacts the etch stop layer 230 and/or modifies the non-metallic surface 250. Accordingly, in one or more embodiments, the bifunctional groups with lone electron pairs and conjugated system are designed for the metallic surface 245 comprising copper, cobalt, ruthenium, tungsten, molybdenum, or combinations thereof. In other words, in some embodiments, the self-assembled monolayer (SAM) 255 selectively blocks metallic surface 245 and yet keeps the non-metallic surface 250 intact during subsequent operations of the method 100, wherein the metallic surface 245 comprises copper, cobalt, ruthenium, tungsten, molybdenum, or combinations thereof.

In some embodiments, the first precursor comprises a structure according to Formula (iii), wherein $R_7$ is selected from H and $C_1$-$C_4$ group, and wherein $R_8$ is $C_1$-$C_4$ group.

(iii)

In some embodiments, the first precursor comprises a structure according to Formula (iv), wherein each of $R_7$ and $R_9$ are independently selected from H and $C_1$-$C_4$ group.

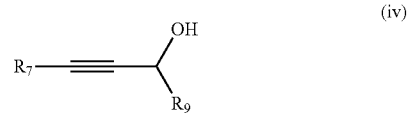

(iv)

In some embodiments, the first precursor comprises a structure according to Formula (v), wherein each of $R_7$ and $R_{10}$ are independently selected from H and $C_1$-$C_4$ group.

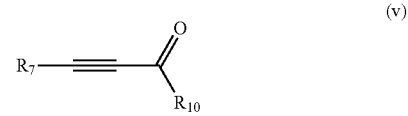

(v)

In some embodiments, the first precursor comprises a structure according to Formula (v), wherein each of $R_{11}$, $R_{12}$, $R_{13}$ and $R_{14}$ are independently selected from H and $C_1$-$C_4$ group.

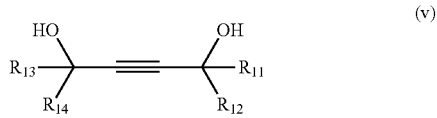

(v)

In some embodiments, the first precursor is selected from the group consisting of structures of Formula (vi), Formula (vii), Formula (viii), Formula (ix), Formula (x), Formula (xi), Formula (xii) and Formula (xiii).

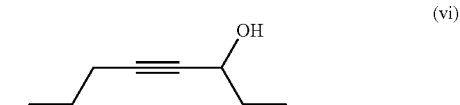

(vi)

(vii)

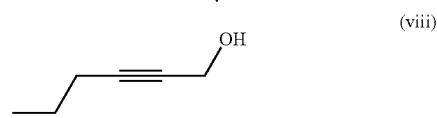

(viii)

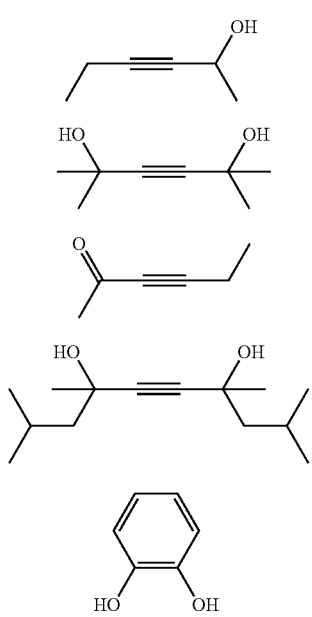

In one or more embodiments, the first precursor has a molecular weight in a range of from 50 Dalton to 500 Dalton, from 100 Dalton to 500 Dalton, from 200 Dalton to 500 Dalton, from 300 Dalton to 500 Dalton, from 400 Dalton to 500 Dalton, from 50 Dalton to 400 Dalton, from 100 Dalton to 400 Dalton, from 200 Dalton to 400 Dalton, from 300 Dalton to 400 Dalton, from 50 Dalton to 300 Dalton, from 100 Dalton to 300 Dalton, from 200 Dalton to 300 Dalton, from 50 Dalton to 200 Dalton, from 100 Dalton to 200 Dalton or from 50 Dalton to 100 Dalton. In some embodiments, the first precursor has a molecular weight less than 500 Dalton, less than 400 Dalton, less than 300 Dalton or less than 100 Dalton.

In one or more embodiments, the first precursor has a vapor pressure in a range of from 100 mTorr to 100 Torr, from 300 mTorr to 100 Torr, from 500 mTorr to 100 Torr, from 800 mTorr to 100 Torr, from 100 mTorr to 50 Torr, from 300 mTorr to 50 Torr, from 500 mTorr to 50 Torr, from 800 mTorr to 50 Torr, from 100 mTorr to 10 Torr, from 300 mTorr to 10 Torr, from 500 mTorr to 10 Torr, from 800 mTorr to 10 Torr, from 100 mTorr to 1 Torr, from 300 mTorr to 1 Torr, from 500 mTorr to 1 Torr, from 800 mTorr to 1 Torr, from 100 mTorr to 8 mTorr, from 300 mTorr to 800 mTorr, from 500 mTorr to 800 mTorr, from 100 mTorr to 500 mTorr, from 300 mTorr to 500 mTorr or from 100 mTorr to 300 mTorr at 120° C. in some embodiments, the first precursor has a vapor pressure more than 100 mTorr, more than 300 mTorr, more than 500 mTorr, more than 800 mTorr, more than 1 Torr, more than 10 Torr, more than 50 Torr or more than 90 Torr.

In one or more embodiments, the substrate 210 can be exposed to the first precursor at any suitable flow rate to form the self-assembled monolayer (SAM) 255. In some embodiments, the substrate 210 is exposed to the first precursor at a flow rate in a range of from 50 sccm to 2000 sccm, from 100 sccm to 2000 sccm, from 500 sccm to 2000 sccm, from 1000 sccm to 2000 sccm, from 1500 sccm to 2000 sccm, from 50 sccm to 100 sccm, from 75 sccm to 100 sccm. In some embodiments, the flow rate of the first precursor is less than or equal to 2000 sccm, less than or equal to 1500 sccm, less than or equal to 1000 sccm, less than or equal to 600 sccm, less than or equal to 500 sccm, less than or equal to 400 sccm, less than or equal to 300 sccm, less than or equal to 250 sccm, less than or equal to 200 sccm, less than or equal to 150 sccm, less than or equal to 100 sccm, less than or equal to 75 sccm, or less than or equal to 50 sccm.

In some embodiments, the substrate 210 is soaked in a vapor of the first precursor. In some embodiments, the soak period can be any suitable period for forming the self-assembled monolayer (SAM) 255. In some embodiments, the soak period is greater than or equal to 10 s, greater than or equal to 20 s, greater than or equal to 30 s, greater than or equal to 45 s, greater than or equal to 60 s, greater than or equal to 80 s, greater than or equal to 120 s, greater than or equal to 150 s, or greater than or equal to 200 s.

In one or more embodiments, the first precursor is liquid at the operating temperature and/or operating pressure. In one or more embodiments, the first precursor is solid at the operating temperature and/or operating pressure. In some embodiments, the first precursor is stored in an ampoule or a cylinder, from which the first precursor is delivered to the substrate 210. In some embodiments, the first precursor has a vapor pressure in a range of from 0.1 Torr to 150 Torr, from 0.1 Torr to 100 Torr, from 0.1 Torr to 50 Torr, from 0.1 Torr to 10 Torr, from 0.1 Torr to 1 Torr, from 0.1 Torr to 0.5 Torr, from 0.5 Torr to 150 Torr, from 0.5 Torr to 100 Torr, from 0.5 Torr to 50 Torr, from 0.5 Torr to 10 Torr, from 0.5 Torr to 1 Torr, from 1 Torr to 150 Torr, from 1 Torr to 100 Torr, from 1 Torr to 50 Torr, from 1 Torr to 10 Torr, from 10 Torr to 150 Torr, from 10 Torr to 100 Torr, from 10 Torr to 50 Torr, from 50 Torr to 150 Torr, from 50 Torr to 100 Torr, or from 100 Torr to 150 Torr at the operating temperature and/or operating pressure. In some embodiments, the first precursor has a vapor pressure greater than or equal to about 0.1 Torr at the operating temperature and/or operating pressure.

In one or more embodiments, the first precursor is substantially free from one or more of metal, halogen or nitrogen. As used in this manner, the term "substantially free" means that the first precursor has less than 10% weight on atomic basis, less than 5% weight on atomic basis, less than 3% weight on atomic basis or less than 1% weight on atomic basis.

In one or more embodiments, the first precursor further comprises a carrier gas. In some embodiments, the carrier gas is a non-reactive gas. In some embodiments, the carrier gas comprises a noble gas. In some embodiments, the noble gas includes one or more of helium (He), neon (Ne), or argon (Ar). In some embodiments, the carrier gas comprises argon (Ar).

In some embodiments, a flow of the carrier gas is configured to carry the first precursor from a container to the substrate 210. In some embodiments, the flow rate of the argon (Ar) gas that is configured to carry the first precursor to the substrate 210 is controlled.

Figure 2C:
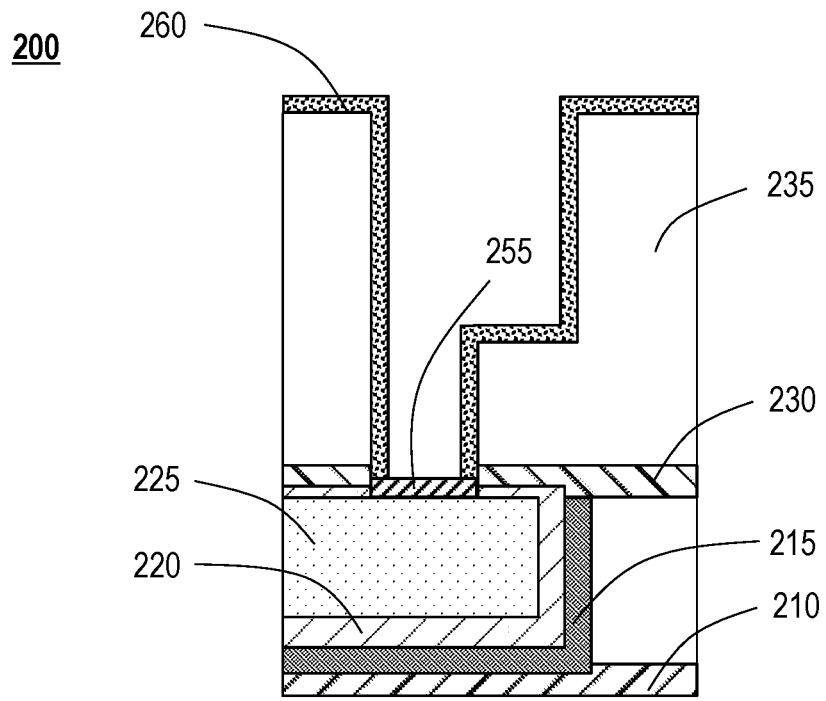

Referring to FIG. 1, at operation 106, the substrate 210 is exposed to a second precursor for selectively depositing a liner on the second surface 250. FIG. 2C illustrates the liner 260 being selectively deposited on the second surface 250. In some embodiments, the liner 260 is formed on the second surface 250 and not on the first surface 245. In some embodiments, the liner 260 is a conformal layer. The liner 260 may comprise any suitable material known to the skilled artisan and may be deposited by any suitable technique known to the skilled artisan. In some embodiments, the liner 260 comprises a metal nitride. In some embodiments, the liner 260 comprises tantalum nitride (TaN), titanium nitride (TiN), or combinations thereof. In some embodiments, the liner 260 has the same properties as the barrier layer 215. In some embodiments, the liner 260 is selectively deposited by atomic layer deposition (ALD). In some embodiments, the self-assembled monolayer (SAM) 255 selectively blocks metal interface 245 and yet keeps the non-metallic surface 250 intact for selective ALD deposition. In some embodiments, the liner 260 is deposited by sequentially exposing the substrate 210 to a metal precursor and a reactant. In some embodiments, the liner 260 is formed without the use of plasma. In some embodiments, the liner 260 has a thickness in a range of from about 2 Å to about 20 Å. In some embodiments, the liner 260 is formed in a single ALD cycle. In some embodiments, the liner 260 is formed in from 1 to 40 ALD cycles. In one or more embodiments, each cycle of the 1 to 40 ALD cycles is configured to deposit a thickness of about 0.5 Å of the liner 260.

Figure 2D:
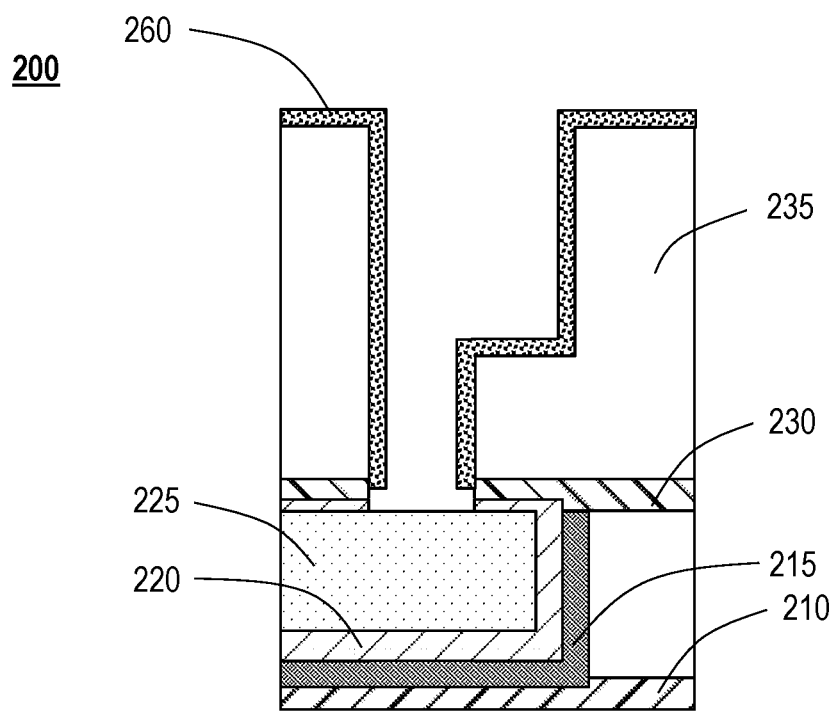

Referring to FIG. 1, at operation 108, the self-assembled monolayer (SAM) 255 is removed. FIG. 2D illustrates the self-assembled monolayer (SAM) 255 removed from the first surface 245. The self-assembled monolayer (SAM) 255 is removed by an etch process. In some embodiments, the etch process may comprise any suitable means, including but not limited to, plasma cleaning processes. In one or more embodiments, the self-assembled monolayer (SAM) 255 is removed by a plasma treatment. In some embodiments, the plasma comprises one or more of hydrogen ($H_2$), nitrogen ($N_2$), or argon (Ar) plasma. As used in this specification, a plasma comprising hydrogen, nitrogen, or argon, means a plasma formed from the molecular form of the species named. In some embodiments, the plasma consists essentially of hydrogen, nitrogen, argon, or combinations thereof. In some embodiments, the self-assembled monolayer (SAM) 255 is removed without causing substantially damage to the liner 260.

The power of the plasma may be varied depending on the composition, packing and/or thickness of the self-assembled monolayer (SAM) and composition and/or thickness of the surrounding materials. In some embodiments, the plasma power is in a range of about 20 W to about 500 W, in a range of about 20 W to about 400 W, in a range of about 20 W to about 250 W, in a range of about 50 W to about 500 W, in a range of about 100 W to about 500 W, in a range of about 100 W to about 450 W, in a range of about 100 W to about 500 W, or in a range of about 200 W to about 400 W. In some embodiments, the plasma power is about 50 W, about 200 W or about 400 W.

The duration of the plasma exposure may be varied depending on the composition, packing and/or thickness of the self-assembled monolayer (SAM) 255 and composition and/or thickness of the surrounding materials. In some embodiments, the substrate is exposed to the plasma for a time period in a range of about 2 s to about 60 s, in a range of about 3 s to about 30 s, or in a range of about 5 s to about 10 s. In some embodiments, the substrate is exposed to the plasma for a time period of about 3 s, about 5 s, about 10 s, or about 30 s.

Figure 2E:
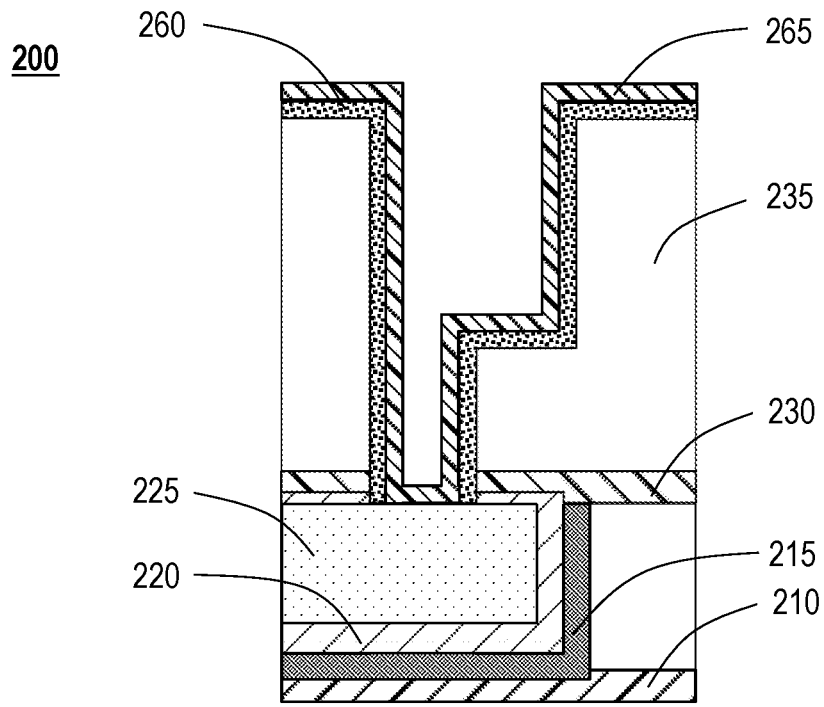
Figure 2F:
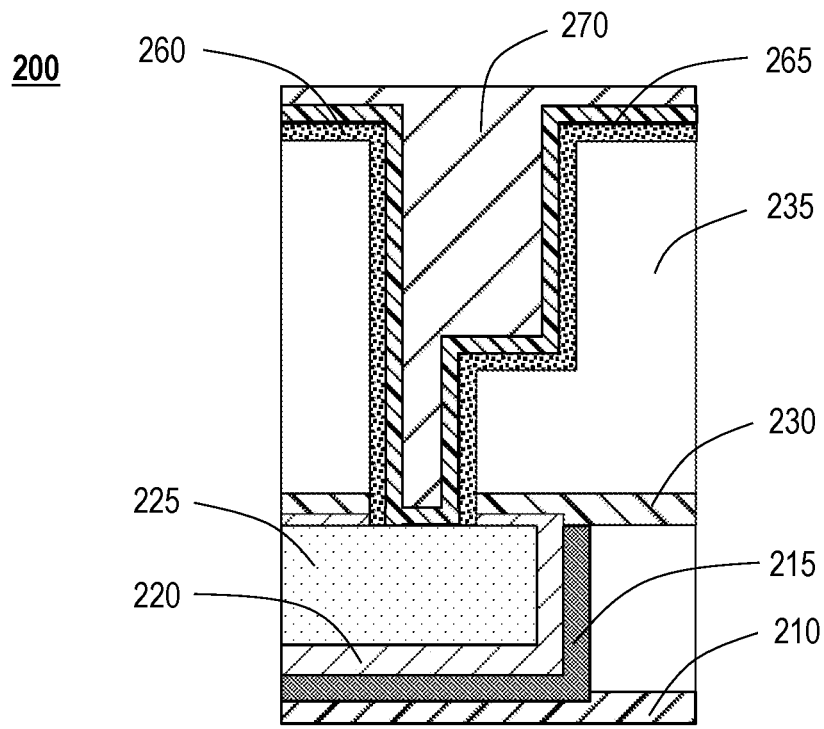

Referring to FIG. 1 and to FIG. 2E, at operation 110, an adhesion layer 265 is deposited on the barrier layer 260 and the first surface 245. FIG. 2F illustrates the adhesion layer 265 deposited on the barrier layer 260 and the first surface 245. In some embodiments, the adhesion layer 265 is conformally deposited on the barrier layer 260 and the first surface 245. In some embodiments, the thickness of the adhesion layer 265 on the barrier layer 260 is same as the thickness of the adhesion layer 265 on the first surface 245. In some embodiments, the thickness of the adhesion layer 265 on the barrier layer 260 is different from the thickness of the adhesion layer 265 on the first surface 245. In some embodiments, the thickness of the adhesion layer 265 on the barrier layer 260 that is greater than the thickness of the adhesion layer 265 on the first surface 245. In some embodiments, the adhesion layer 265 comprises any suitable material known to the skilled artisan and may be deposited by any suitable technique known to the skilled artisan.

Referring to FIG. 1 and FIG. 2F, at operation 112, the method 100 includes depositing a conductive material 270 in the at least one feature 240 by exposing the substrate to a third precursor. In some embodiments, the third precursor comprises a metal. In some embodiments, the third precursor comprises copper, cobalt, ruthenium, tungsten, molybdenum, or combinations thereof. In some embodiments, the conductive material 270 is deposited by a gap fill process on the adhesion layer 265. In some embodiments, the gap fill process comprises a bottom-up fill or a conformal fill. FIG. 2G shows the conductive material 270 forming the interconnect within the feature 245.

The conductive material 270 can be any suitable material known to the skilled artisan. In some embodiments, the conductive fill material 270 comprises one or more of copper (Cu), cobalt (Co), ruthenium (Ru), tungsten (W), and molybdenum (Mo).

In some embodiments, the feature 240 comprises a bottom portion and a top portion. In some embodiments, the bottom portion comprises a via. In some embodiments, the top portion comprises a trench. In some embodiments, a first conductive fill material is grown in a bottom-up manner to fill the via portion that makes up the lower portion of the feature 240. In some embodiments, a second conductive material is deposited in the upper portion. In some embodiments, the first conductive material and the second conductive material are same. In some embodiments, the first conductive material and the second conductive material are different. In some embodiments, the entire feature 240 is filled with a single conductive material at one time to fill the lower portion and upper portion of the feature 240 in one process.

The conductive material 270 can be deposited by any suitable technique known to the skilled artisan. In some embodiments, the conductive material 270 is deposited by one or more of a chemical vapor deposition (CVD) process, an atomic layer deposition (ALD) process, or a physical vapor deposition (PVD) process. In some embodiments, the conductive material 270 is deposited to overfill the feature 240 and form an overburden on the surface of the substrate 210. The overburden is then removed by any suitable technique (e.g., etching, chemical-mechanical planarization (CMP)).

Without intending to be bound by theory, it is believed that the self-assembled monolayer (SAM) 255 increases the resistance of the conductive fill material 270 only marginally when compared to the increase in resistance typically seen with most barrier layers (e.g., film 260). Accordingly, the removal of the self-assembled monolayer (SAM) 255 is an optional process which may further decrease the resistance of the conductive fill material 270. In some embodiments, the removal of the self-assembled monolayer (SAM) 255 decreases a resistance of the metal interconnect 270 by 30%, 20%, 10% or 5%.

Figure 3:
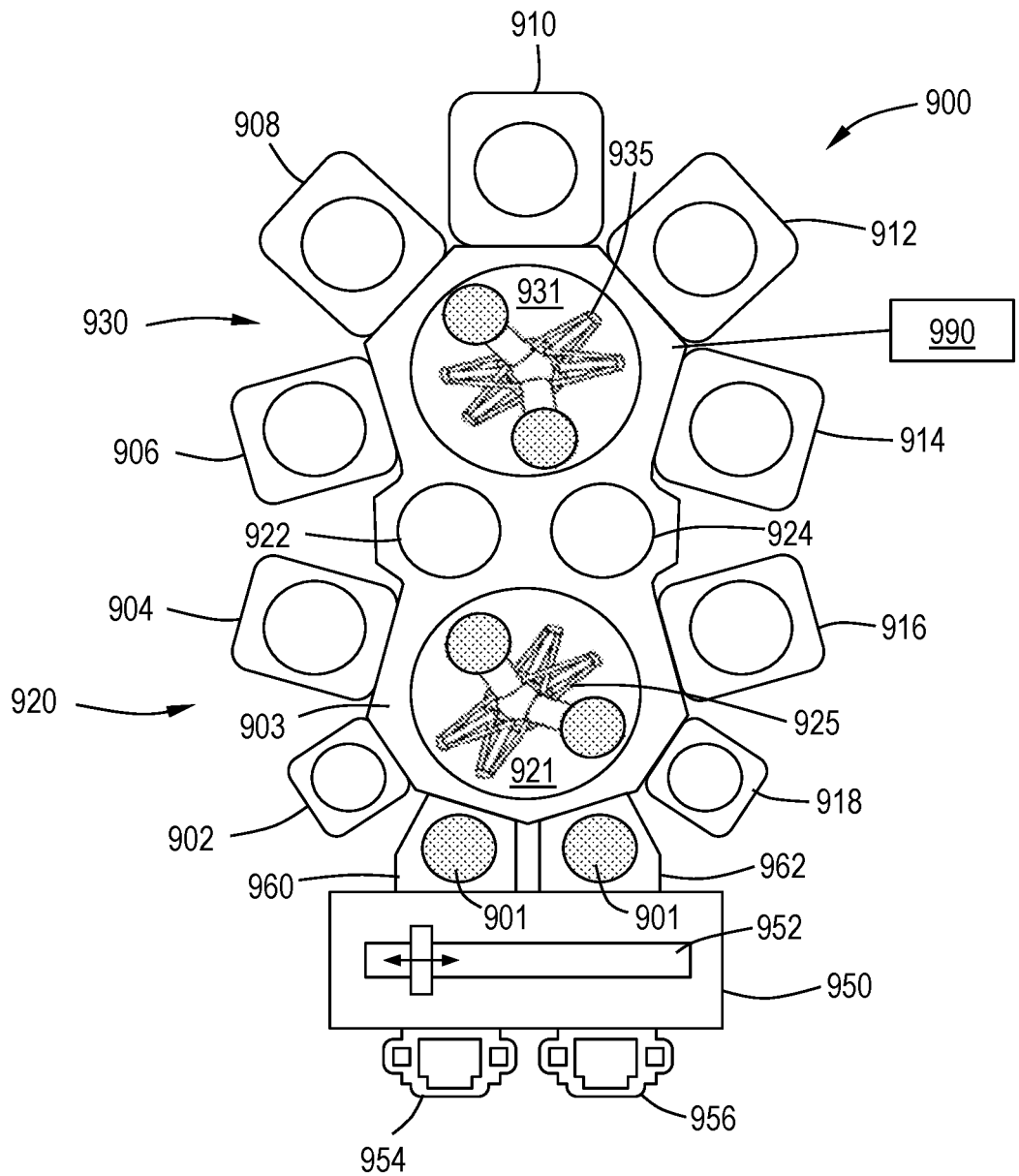
FIG. 3 illustrates an exemplary cluster tool according to one or more embodiments of the disclosure.

Additional embodiments of the disclosure are directed to processing tools 900 for the formation of the devices and methods described, as shown in FIG. 3. A variety of multi-processing platforms, including the Centura®, Dual ACP, Producer® GT, and Endura® platform, available from Applied Materials® as well as other processing systems may be utilized. In one or more embodiments, the cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a selective metal deposition chamber; a barrier metal deposition chamber; a metal deposition chamber; a PVD metal deposition chamber; a CVD metal deposition chamber; a self-assembled monolayer (SAM) deposition chamber; a liner metal deposition chamber; a plasma chamber; a pre-clean chamber; an etching chamber; transfer space(s), a wafer orienter/degas chamber, a cryo cooling chamber, and the like. The particular arrangement of process chambers and components can be varied depending on the cluster tool and should not be taken as limiting the scope of the disclosure.

In one or more embodiments, the cluster tool 900 includes a self-assembled monolayer (SAM) deposition chamber to expose the substrate to a planar hydrocarbon and form a self-assembled monolayer (SAM). In one or more embodiments, the cluster tool 900 includes a pre-cleaning chamber connected to the central transfer station.

In the embodiment shown in FIG. 3, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In one or more embodiments, the processing tool 900 comprises a central transfer station 921, 931 comprising at least one robot 925, 935 configured to move a wafer; one or more of a selective via fill station, a reversely selective deposition station, a self-assembled monolayer (SAM) formation station, a CVD station, a PVD station connected to the central transfer station; an optional pre-clean station connected to the central transfer station; and at least one controller connected to the one or more of the central transfer station, selective via fill station, a reversely selective deposition station, a self-assembled monolayer (SAM) formation station, a CVD station, a PVD station or the optional pre-clean station. In one or more embodiments, the at least one controller has at least one configuration selected from: a configuration to move the wafer between stations using the robot; a configuration to selectively fill a via; a configuration to expose a substrate to a planar hydrocarbon and form a self-assembled monolayer (SAM); a configuration for reversely selective deposition of a barrier layer; a configuration to deposit a metal; and a configuration to pre-clean the wafer.

In one or more embodiments, a processing tool comprises: a pre-clean chamber having a substrate support therein; a selective metal deposition chamber; a barrier metal deposition chamber; a metal deposition chamber; a PVD metal deposition chamber; a CVD metal deposition chamber; optionally, a self-assembled monolayer (SAM) deposition chamber with an optional pre-clean; optionally, a liner metal deposition chamber; optionally, a plasma chamber; optionally, an etching chamber; a robot configured to access the pre-clean chamber, the selective deposition chamber, the optional self-assembled monolayer (SAM) deposition chamber, the barrier metal deposition chamber, the PVD metal deposition chamber, the optional plasma chamber; and the optional etching chamber, the optional liner metal deposition chamber, the CVD metal deposition chamber and the PVD metal deposition chamber; and a controller connected to the pre-clean chamber, the selective deposition chamber, the optional self-assembled monolayer (SAM) deposition chamber, the barrier metal deposition chamber, the PVD metal deposition chamber, the optional plasma chamber; and the optional etching chamber, the optional liner metal deposition chamber, the CVD metal deposition chamber and the PVD metal deposition chamber, and the robot, the controller having one or more configurations selected from: cleaning a substrate, selectively forming a self-assembled monolayer (SAM), selectively depositing a liner, optionally forming a metal liner, forming a metallization layer, optional etching the substrate, and, optionally removing the self-assembled monolayer (SAM).

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor structure, the method comprising:
    selectively depositing a self-assembled monolayer (SAM) on a first surface of a substrate by exposing the substrate to a first precursor, wherein the substrate has at least one feature comprising the first surface and a second surface and wherein the first precursor is selected from the group consisting of structures of Formula (vi), Formula (vii), Formula (viii), Formula (ix), Formula (xi), Formula (xii) and Formula (xiii)

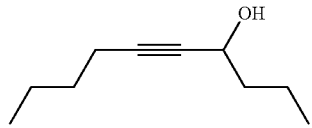

(vi)

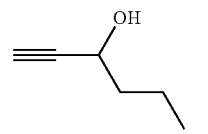

(vii)

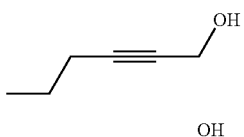

(viii)

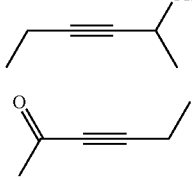

(ix)

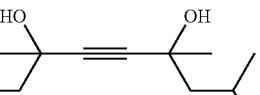

(xi)

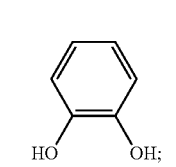

(xii)

(xiii)

selectively depositing a liner on the second surface by exposing the substrate to a second precursor; and
    removing the self-assembled monolayer (SAM),
    wherein the first surface comprises a metal, and the second surface comprises a dielectric material.

2. The method of claim 1, wherein selectively depositing the self-assembled monolayer (SAM) comprises forming the SAM on the first surface and not on the second surface.

3. The method of claim 1, wherein selectively depositing the liner comprises forming the liner on the second surface and not on the first surface.

4. The method of claim 1, further comprising cleaning the substrate before depositing the self-assembled monolayer (SAM) to form a substrate surface substantially free of oxide.

5. The method of claim 1, wherein the first surface comprises one or more of copper (Cu), cobalt (Co), ruthenium (Ru), tungsten (W), and molybdenum (Mo).

6. The method of claim 1, further comprising depositing an adhesion layer on the first surface and on the liner after removing the self-assembled monolayer (SAM).

7. The method of claim 1, wherein the at least one feature comprises one or more of a trench and a via.

8. The method of claim 1, further comprising depositing a conductive material in the at least one feature by exposing the substrate to a third precursor, the third precursor comprising a metal.

9. The method of claim 8, wherein depositing the conductive material comprises one or more of a bottom-up gap fill and a conformal gap fill.

10. The method of claim 1, wherein the first precursor has a vapor pressure in a range of from 100 mTorr to 100 Torr at 120° C.

11. The method of claim 1, wherein the first precursor is substantially free from one or more of metal, halogen or nitrogen, the substantially free refers to a less than 5% weight on atomic basis.

12. The method of claim 1, wherein the first precursor has a molecular weight in a range of from 50 Daltons to 500 Daltons.

13. A method of forming a semiconductor structure, the method comprising:
   exposing a substrate to at least one first precursor to selectively deposit a self-assembled monolayer (SAM) on a first surface of the substrate, the substrate having at least one feature comprising the first surface and a second surface;
   exposing the substrate to a second precursor to selectively deposit a liner on the second surface; and
   removing the self-assembled monolayer (SAM),
   wherein the first surface comprises a metal selected from one or more of copper (Cu), cobalt (Co), ruthenium (Ru), tungsten (W) and molybdenum (Mo),
   wherein the second surface comprises a dielectric material,
   wherein the first precursor has a molecular weight in a range of from 50 Daltons to 500 Daltons, and
   wherein the first precursor is selected from the group consisting of structures of Formula (vi), Formula (vii), Formula (viii), Formula (ix), Formula (xi), Formula (xii) and Formula (xiii)

14. A method of forming a semiconductor structure, the method comprising:
   exposing a substrate to at least one first precursor to selectively deposit a self-assembled monolayer (SAM) on a first surface of the substrate, the substrate having at least one feature comprising the first surface and a second surface;
   exposing the substrate to a second precursor to selectively deposit a liner on the second surface; and
   removing the self-assembled monolayer (SAM),
   wherein the first surface comprises a metal selected from one or more of tungsten (W) and molybdenum (Mo),
   wherein the second surface comprises a dielectric material,
   wherein the first precursor has a vapor pressure in a range of from 100 mTorr to 100 Torr at 120° C., and
   wherein the first precursor is selected from the group consisting of structures of Formula (vi), Formula (vii), Formula (viii), Formula (ix), Formula (xi), Formula (xii) and Formula (xiii)

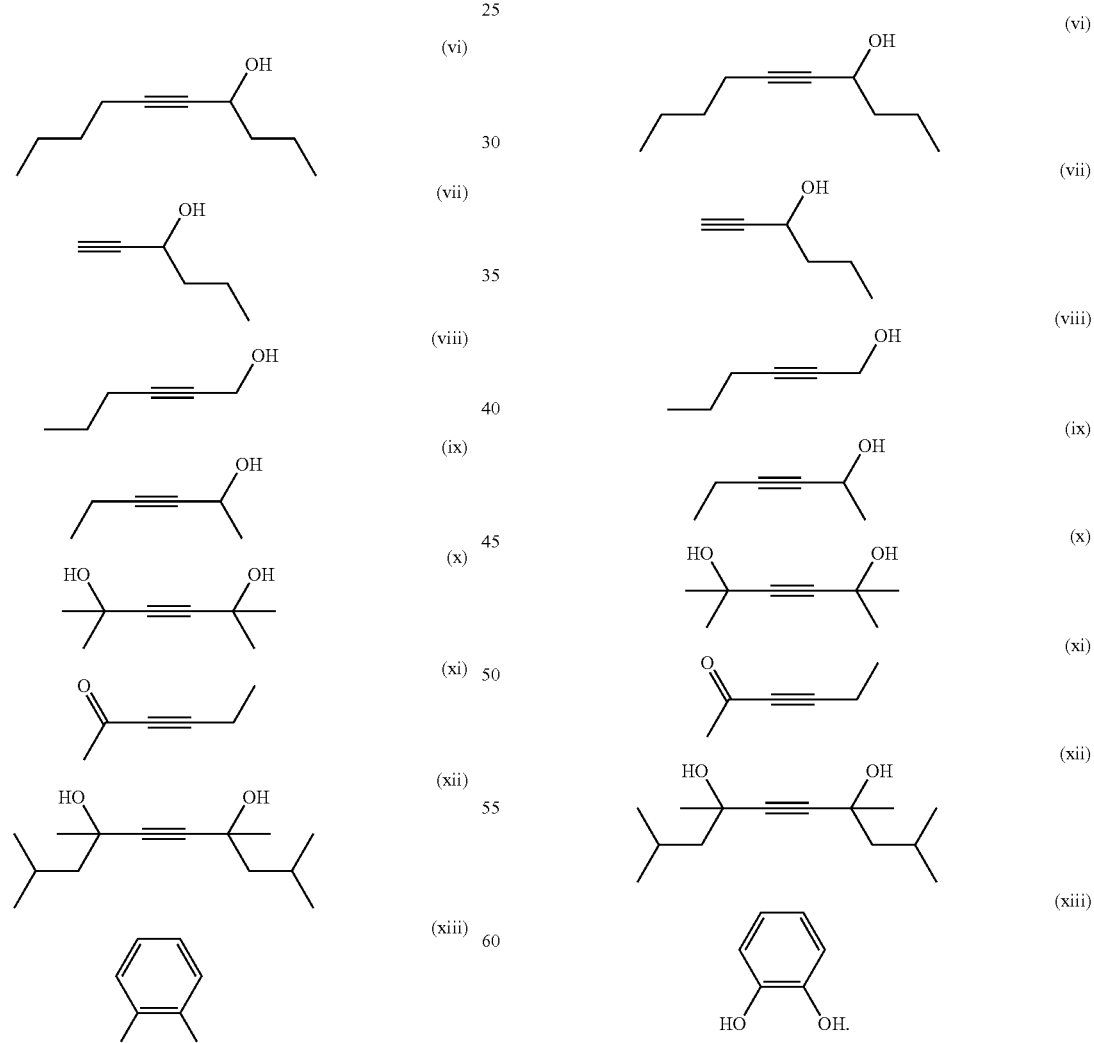

* * * * *